United States Patent
Lee et al.

(10) Patent No.: US 8,441,123 B1
(45) Date of Patent: May 14, 2013

(54) SEMICONDUCTOR DEVICE WITH METAL DAM AND FABRICATING METHOD

(75) Inventors: Dong Hee Lee, Incheon (KR); Min Yoo, Seoul (KR); Dae Byoung Kang, Seoul (KR); Bae Yong Kim, Jeollanam-do (KR)

(73) Assignee: Amkor Technology, Inc., Chandler, AZ (US)

( * ) Notice: Subject to any disclaimer, the term of this patent is extended or adjusted under 35 U.S.C. 154(b) by 449 days.

(21) Appl. No.: 12/540,593

(22) Filed: Aug. 13, 2009

(51) Int. Cl.
*H01L 23/48* (2006.01)
*H01L 23/52* (2006.01)
*H01L 29/40* (2006.01)

(52) U.S. Cl.
USPC .............. 257/737; 257/777; 257/E21.503

(58) Field of Classification Search .......... 257/686, 257/777–780; 438/124
See application file for complete search history.

(56) References Cited

U.S. PATENT DOCUMENTS

| | | | |
|---|---|---|---|
| 5,719,440 A * | 2/1998 | Moden | 257/697 |
| 6,391,682 B1 | 5/2002 | Tsai et al. | |
| 6,400,036 B1 | 6/2002 | Tang et al. | |
| 6,404,059 B1 * | 6/2002 | Iwasaki et al. | 257/774 |
| 7,880,276 B2 * | 2/2011 | Nishimura et al. | 257/667 |
| 2006/0055062 A1 * | 3/2006 | Ohta | 257/784 |
| 2007/0045870 A1 | 3/2007 | Kuramochi | |
| 2009/0166888 A1 * | 7/2009 | Pozder et al. | 257/777 |

\* cited by examiner

*Primary Examiner* — Chuong A Luu
*Assistant Examiner* — Nga Doan
(74) *Attorney, Agent, or Firm* — McAndrews, Held & Malloy, Ltd.

(57) ABSTRACT

A semiconductor device has a first semiconductor die having at least one metal pillar formed along an inner perimeter and at least one bond pad formed along an outer perimeter. A second semiconductor die has at least one metal pillar. A conductive bump connects the at least one metal pillar of the first semiconductor die to the at least one metal pillar of the second semiconductor die. At least one metal dam is formed on the first semiconductor die between the at least one metal pillar of the first semiconductor die and the at least one bond pad.

26 Claims, 5 Drawing Sheets

US 8,441,123 B1

SEMICONDUCTOR DEVICE WITH METAL DAM AND FABRICATING METHOD

FIELD OF THE INVENTION

This invention relates to a semiconductor device and, more specifically, to a semiconductor device with metal dam and a fabricating method thereof.

BACKGROUND OF THE INVENTION

Multiple semiconductor dies may be mounted in a single package in one of two ways. Firstly, two or more semiconductor dies may be arranged next to one another in a horizontal direction along a substrate. Secondly, multiple semiconductor dies may be mounted on top of one another in a vertical direction, i.e. packaging the semiconductor dies into a chip-on-chip (COC) structure ('COC packaging method').

The COC packaging method includes preparing a bottom semiconductor die having a plurality of bond pads and a top semiconductor die having a plurality of bond pads. The bond pads of the bottom semiconductor die are interconnected to the bond pads of the top semiconductor die using conductive bumps. An underfill is injected into a gap between the bottom semiconductor die and the top semiconductor die. Bond pads formed around the circumference of the bottom semiconductor die are connected to a circuit board through conductive wires.

In the COC packaging method, a problem may occur in that an excessive flow of the underfill in the circumferential direction of the bottom semiconductor die may occur during injection. The underfill may cover the bond pads formed around the circumference of the bottom semiconductor die thus making it impossible for the wires to be bonded to the bond pads.

Therefore, a need existed to provide a system and method to overcome the above problem.

SUMMARY OF THE INVENTION

A semiconductor device has a first semiconductor die having at least one metal pillar formed along an inner perimeter and at least one bond pad formed along an outer perimeter. A second semiconductor die has at least one metal pillar. A conductive bump connects the at least one metal pillar of the first semiconductor die to the at least one metal pillar of the second semiconductor die. At least one metal dam is formed on the first semiconductor die between the at least one metal pillar of the first semiconductor die and the at least one bond pad.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
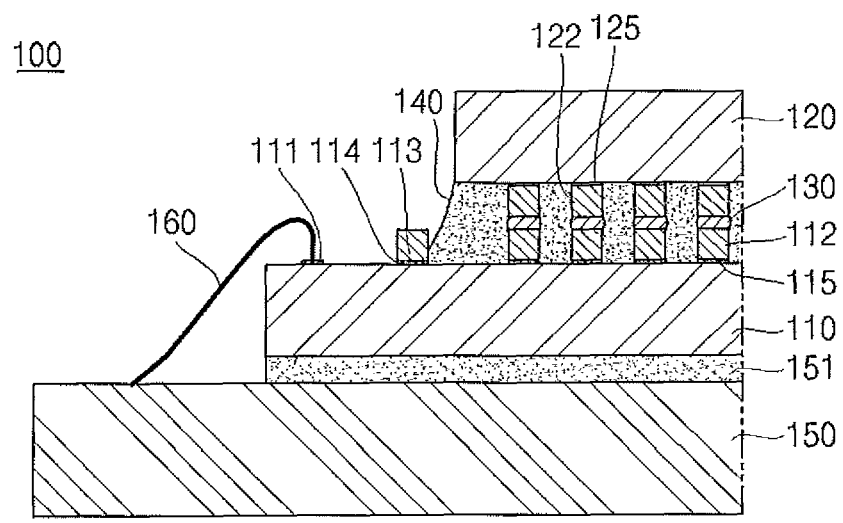
FIG. 1 is a partial cross-sectional view illustrating a semiconductor device having a metal dam according to an embodiment of the present invention.

Referring to FIG. 1, a partial cross-sectional view of a semiconductor device 100 having a metal dam according to one embodiment of the present invention is illustrated. The semiconductor device 100 may include a first semiconductor die 110, a second semiconductor die 120, conductive bumps 130, an underfill 140, substrate 150 and a conductive wire 160.

There is no restriction on the type of die for the first semiconductor die 110. For example, the first semiconductor die 110 may be selected from silicon semiconductors, GaAs semiconductors and equivalents thereof that are commonly known in the art. The first semiconductor die 110 may include at least one bond pad 111 formed substantially along a circumference thereof. Further, the first semiconductor die 110 may include first metal pillars 112 disposed substantially at a central area thereof.

The first semiconductor die 110 may include at least one metal dam 113 formed between the bond pad 111 and the first metal pillars 112. The metal dam 113 may be used to prevent an underfill 140 from bleeding out.

The first metal pillars 112 may be made of a material selected from gold (Au), nickel (Ni), copper (Cu), eutectic solders, lead-free solders, nickel-gold (Ni—Au) alloys, copper-nickel (Cu—Ni) alloys, copper (Cu) lead-free solders, and equivalents thereof. However, there is no restriction on the material of the first metal pillars 112. Bond pads or redistribution layers (RDLs) 115 may be positioned under the first metal pillars 112. The metal dam 113 may be made of a material selected from gold, nickel, copper, eutectic solders, lead-free solders, nickel-gold alloys, copper-nickel alloys, copper lead-free solders, and equivalents thereof. However, there is no restriction on the material of the metal dam 113.

A seed metal layer 114 may be formed under the metal dam 113. The seed metal layer 114 may be formed of a material selected from titanium (Ti), titanium tungsten (TiW) and equivalents thereof. However, there is no restriction on the material of the seed metal layer 114. The metal dam 113 may be greater in thickness than the first metal pillars 112. With these dimensions, the metal dam 113 can efficiently prevent the underfill 140 from bleeding out. The metal dam 113 may have a width of 1 to 100 μm, at which the form factor of the semiconductor device 100 can be improved.

There is no restriction on the kind of the second semiconductor die 120. For example, the second semiconductor die 120 may be selected from silicon semiconductors, GaAs semiconductors and equivalents thereof that are commonly known in the art. The second semiconductor die 120 includes a plurality of second metal pillars 122 disposed substantially at a central area center thereof. The second metal pillars 122 may be made of a material selected from gold (Au), nickel (Ni), copper (Cu), eutectic solders, lead-free solders, nickel-gold (Ni—Au) alloys, copper-nickel (Cu—Ni) alloys, copper (Cu) lead-free solders, and equivalents thereof. However, there is no restriction on the material of the second metal pillars. Bond pads or redistribution layers (RDLs) 125 may be positioned under the second metal pillars 122. The second semiconductor die 120 may have a width smaller than that of the first semiconductor die 110. Accordingly, the bond pad 111 of the first semiconductor die 110 is positioned outside the second semiconductor die 120. This configuration allows wire bonding of the bond pad 111.

The conductive bumps 130 may be used to electrically connect the first metal pillars 112 of the first semiconductor die 110 to the second metal pillars 122 of the second semiconductor die 120. The conductive bumps 130 may be made of a material selected form eutectic solders, lead-free solders, and equivalents thereof. However, there is no restriction on the material of the conductive bumps 130. The conductive bumps 130 may have a melting point lower than the melting points of the first metal pillars 112, the metal dam 113 and the second metal pillars 122. Accordingly, when the conductive bumps 130 are melted, the first metal pillars 112, the metal dam 113 and the second metal pillars 122 maintain their fine pitches without collapsing.

In accordance with one embodiment, the thicknesses of the first metal pillars 112, the metal dam 113 and the second metal pillars 122 may be in the range of approximately 5 to 50 μm. However, the thicknesses of the aforementioned are not limited to this range. The thickness of the conductive bumps 130 may be in the range of approximately 1 to 20 μm. However, the conductive bumps 130 are not limited to this range. The first metal pillars 112 and the second metal pillars 122 may be designed to be greater in thickness than the conductive bumps 130, so that stress can be sufficiently absorbed. Of course, the metal dam 113 may be designed to be greater in thickness than the conductive bumps 130, so that the underfill 140 can be sufficiently prevented from bleeding out.

The underfill 140 is filled between the first semiconductor die 110 and the second semiconductor die 120 to substantially surround the first metal pillars 112, the second metal pillars 122 and the conductive bumps 130. The underfill 140 serves to remove stress resulting from the difference in coefficient of thermal expansion between the first semiconductor die 110 and the second semiconductor die 120. The underfill 140 in a liquid state flows outwardly ('bleeding out') from the second semiconductor die 120 during injection. If bleeding out of the underfill 140 is excessive, the bond pad 111 of the first semiconductor die 110 is covered with the underfill 140, making it impossible for the wire to bonded thereto. In this embodiment, the metal dam 113 formed between the bond pad 111 and the first metal pillars 112 of the first semiconductor die 110 prevents excessive bleed-out of the underfill 140 to protect the bond pad 111 of the first semiconductor die 110 from being contaminated by the underfill 140.

The substrate 150 may be adhered to the semiconductor die 110 by means of an adhesive 151. The adhesive 151 may be an adhesive tape, a liquid adhesive, or the like. The listing of the above adhesive types should not be seen as to limit the scope of the present invention. The substrate 150 may be selected from laminated substrates, printed circuit boards, lead frames and equivalents thereof that are commonly known in the art, but is not limited thereto.

The conductive wire 160 serves to electrically interconnect the bond pad 111 of the first semiconductor die 110 to the circuit board 150.

In the semiconductor device 100, the metal dam 113 can be formed simultaneously with the first metal pillars 112, thereby eliminating the need for additional epoxy dam writing. This contributes to an improvement in the form factor of the semiconductor device 100 and enables the fabrication of the semiconductor device 100 in a stable manner. Further, since the metal dam 113 is made of a metal, not a solder, it is not melted during subsequent high-temperature processing. Accordingly, no short-circuiting occurs between the metal dam 113 and the bond pad 111.

Figure 2:
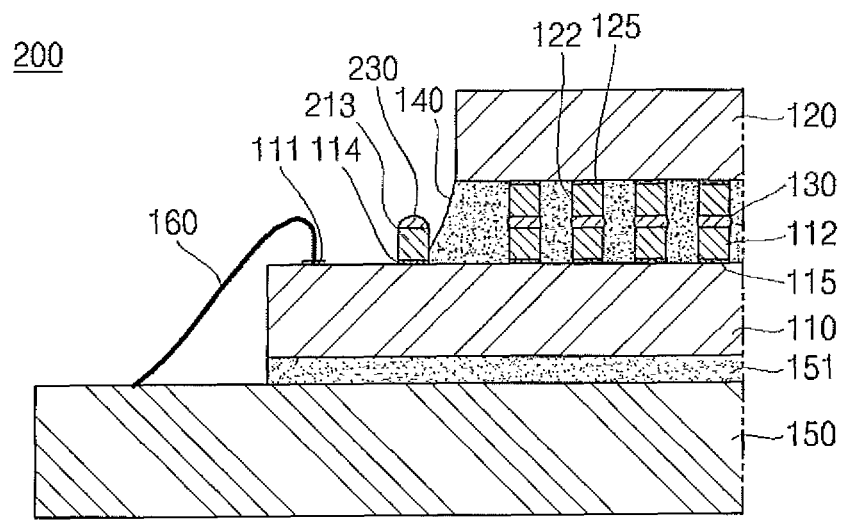
FIG. 2 is a partial cross-sectional view illustrating a semiconductor device having a metal dam according to a further embodiment of the present invention.

Referring to FIG. 2, a partial cross-sectional view of a semiconductor device 200 having a metal dam according to a further embodiment of the present invention is illustrated. The structure of the semiconductor device 200 is similar to that of the semiconductor device 100 illustrated in FIG. 1, and the structural differences between the semiconductor devices 100 and 200 will be explained below.

As illustrated in FIG. 2, the semiconductor device 200 may include a metal dam 213 and a conductive bump 230 formed on the metal dam 213. The conductive bump 230 may be made of a material selected form eutectic solders, lead-free solders, and equivalents thereof. However, there is no restriction on the material of the conductive bump 230.

The formation of the metal dam 213 and the conductive bump 230 leads to an increase in the thickness of the dam to more effectively prevent the underfill 140 from bleeding out. In addition, the need for an additional process is substantially eliminated due to the formation of the conductive bump 230. Metal plating is carried out on both the first metal pillars 112 and the metal dam 213 to simultaneously form the conductive bumps 130 and the conductive bump 230 thereon. That is, as a result of the metal plating, the conductive bump 230 is essentially formed on the metal dam 213. An additional process for removing the conductive bump 230 from the metal dam 213 is required in the fabrication of the semiconductor device 100, whereas the need for the removal of the conductive bump 230 is eliminated in the fabrication of the semiconductor device 200.

Figure 3:
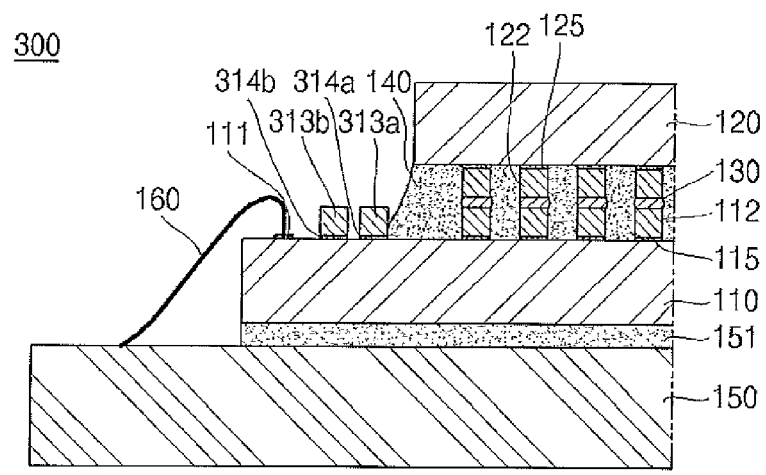
FIG. 3 is a partial cross-sectional view illustrating a semiconductor device having metal dams according to another embodiment of the present invention.

Referring to FIG. 3, a partial cross-sectional view of a semiconductor device 300 having metal dams according to another embodiment of the present invention is illustrated. The structure of the semiconductor device 300 is similar to that of the semiconductor device 100 illustrated in FIG. 1, and the structural differences between the semiconductor devices 100 and 300 will be explained below.

As illustrated in FIG. 3, two metal dams 313a and 313b may be spaced apart from each other in the horizontal direction. The two metal dams 313a and 313b may be made of a material selected from gold, nickel, copper, eutectic solders, lead-free solders, nickel-gold alloys, copper-nickel alloys, copper lead-free solders, and equivalents thereof. However, there is no restriction on the material of the metal dams 313a and 313b. Seed metal layers 314a and 314b may be formed under the metal dams 313a and 313b, respectively. The seed metal layers 314a and 314b may be formed of a material selected from titanium, titanium tungsten and equivalents thereof. However, there is no restriction on the material of the seed metal layers 314a and 314b.

In the semiconductor device 300, the two successive metal dams 313a and 313b more effectively prevent the underfill 140 from bleeding out to reduce the possibility that the underfill 140 overflowing the first metal dam 313a will overflow the second metal dam 313b.

Figure 4:
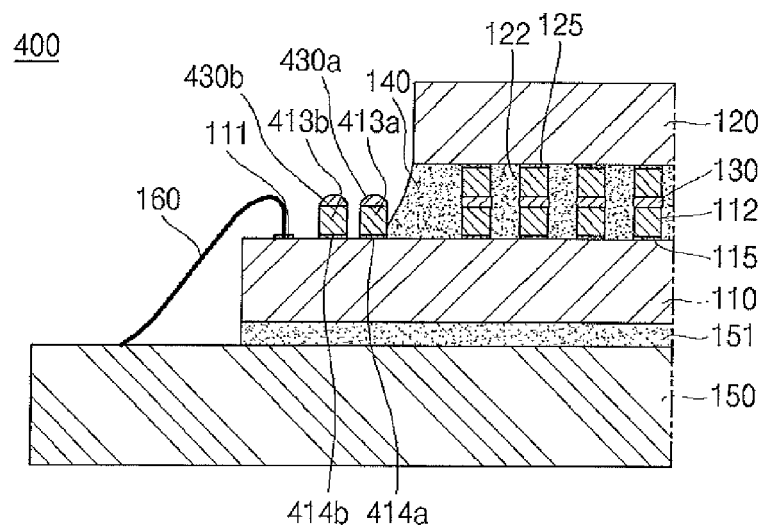
FIG. 4 is a partial cross-sectional view illustrating a semiconductor device having metal dams according to another embodiment of the present invention.

Referring to FIG. 4, a partial cross-sectional view of a semiconductor device 400 having metal dams according to another embodiment of the present invention is illustrated. The structure of the semiconductor device 400 is almost the same as that of the semiconductor device 300 illustrated in FIG. 3, and the structural differences between the semiconductor devices 300 and 400 will be explained below.

As illustrated in FIG. 4, the semiconductor device 400 may include two metal dams 413a and 413b and conductive bumps 430a and 430b formed on the metal dams 413a and 413b, respectively. The conductive bumps 430a and 430b may be made of a material selected form eutectic solders, lead-free solders, and equivalents thereof. However, there is no restriction on the material of the conductive bumps 430a and 430b.

The formation of the metal dams 413a and 413b and the conductive bumps 430a and 430b may lead to an increase in the thickness of the dam to more effectively prevent the underfill 140 from bleeding out. In addition, the need for an additional process is substantially eliminated due to the formation of the conductive bumps 430a and 430b. Metal plating is carried out on both the first metal pillars 112 and the two metal dams 413a and 413b to simultaneously form the conductive bumps 130 and the conductive bumps 430a and 430b thereon. That is, as a result of the metal plating, the conductive bumps 430a and 430b are essentially formed on the metal dams 413a and 413b, respectively. An additional process for removing the conductive bumps 430a and 430b from the metal dams 413a and 413b, respectively, is required in the fabrication of the semiconductor device 300, whereas the need for the removal of the conductive bumps 430a and 430b is eliminated in the fabrication of the semiconductor device 400.

Figure 5:
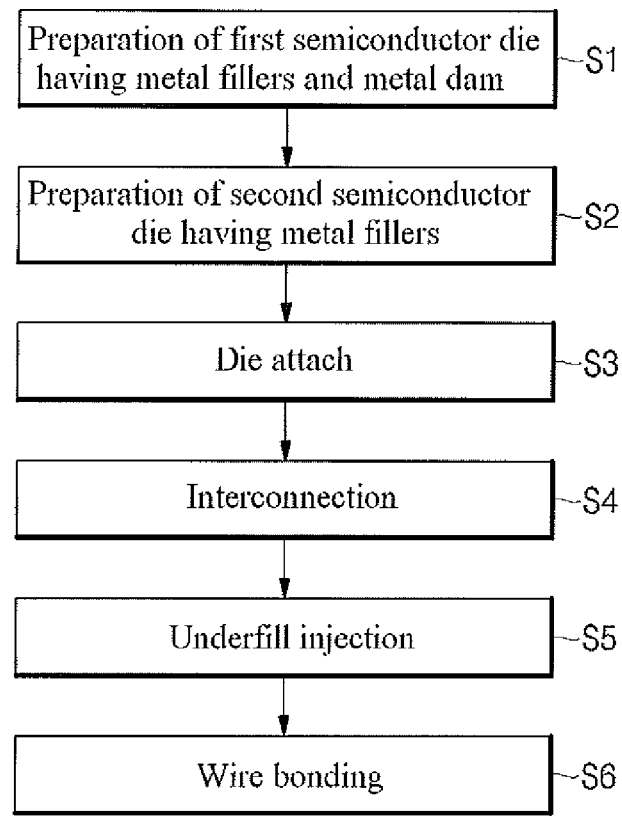
FIG. 5 is a flow chart illustrating a method for fabricating a semiconductor device having a metal dam according to an embodiment of the present invention.

Referring to FIG. 5, a flow chart of a method for fabricating a semiconductor device having a metal dam according to an embodiment of the present invention is illustrated. As illustrated in FIG. 5, the method includes the following steps: preparation of a first semiconductor die (S1), preparation of a second semiconductor die (S2), die attach (S3), interconnection (S4), underfill injection (S5), and wire bonding (S6).

Figure 6A:
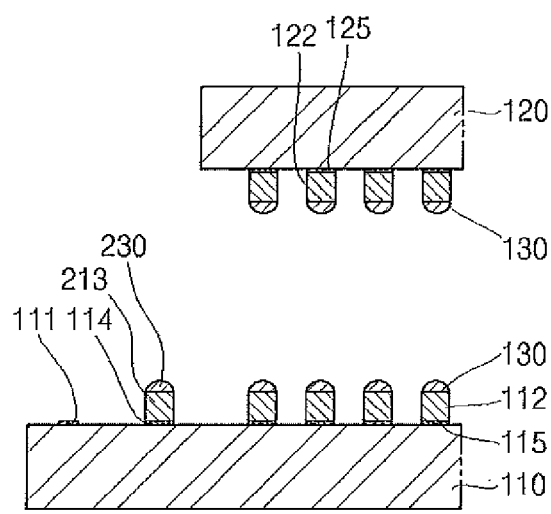
FIGS. 6A through 6E are cross-sectional views sequentially illustrating the method of FIG. 5.

Referring to FIGS. 6A through 6E, cross-sectional views sequentially illustrating the method of FIG. 5 are illustrated. As illustrated in FIG. 6A, a first semiconductor die 110 may have a plurality of first metal pillars 112 and at least one metal dam 213 may be prepared in step S1, and a second semiconductor die 120 having a plurality of second metal pillars 122 may be prepared in step S2.

Specifically, the first metal pillars 112 of the first semiconductor die 110 may be formed by metal plating, and the metal dam 213 may be formed between the bond pad 111 and the first metal pillars 112 by metal plating. The first metal pillars 112 may be simultaneously formed with the metal dam 213.

The first metal pillars 112 may be formed on bond pads and redistribution layers 115. The metal dam 213 may be formed on a seed metal layer 114. Conductive bumps 130 and a conductive bump 230 may be formed on the first metal pillars 112 and the metal dam 213, respectively. The conductive bumps 130 and 230 are formed at the same time.

The second metal pillars 122 of the second semiconductor die 120 may be formed by metal plating. The second metal pillars 122 may be formed on bond pads or redistribution layers 125. The first metal pillars 112 and the second metal pillars 122 may have the same pitches. The conductive bumps 130 may also be formed on the second metal pillars 122. That is, the conductive bumps 130 may be formed on the first metal pillars 112 and/or the second metal pillars 122.

Figure 6B:
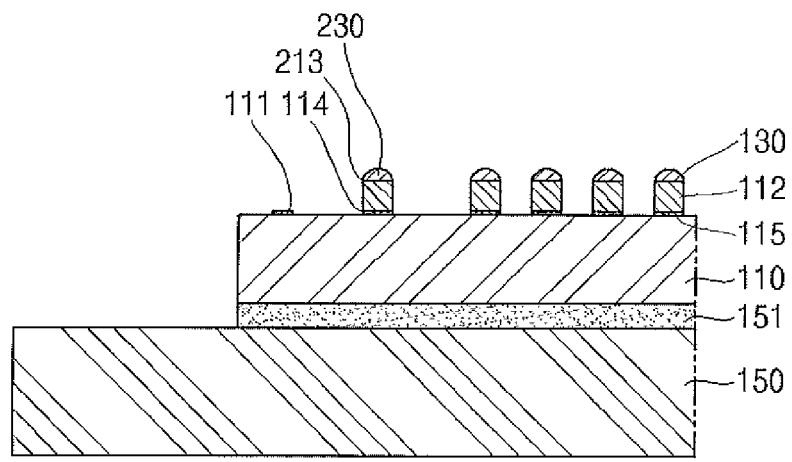

Although steps S1 and S2 are sequentially illustrated in FIGS. 6A and 6B, respectively, the present invention is not limited to this sequence. That is, the first semiconductor die 110 and the second semiconductor die 120 may be prepared simultaneously or in the reverse order.

As illustrated in FIG. 6B, in step S3, the first semiconductor die 110 may be adhered to a substrate 150 using an adhesive 151. The adhesive 151 may be an adhesive tape, a liquid adhesive, or the like. The substrate 150 may be selected from laminated substrates, printed circuit boards, lead frames and equivalents thereof.

Figure 6C:
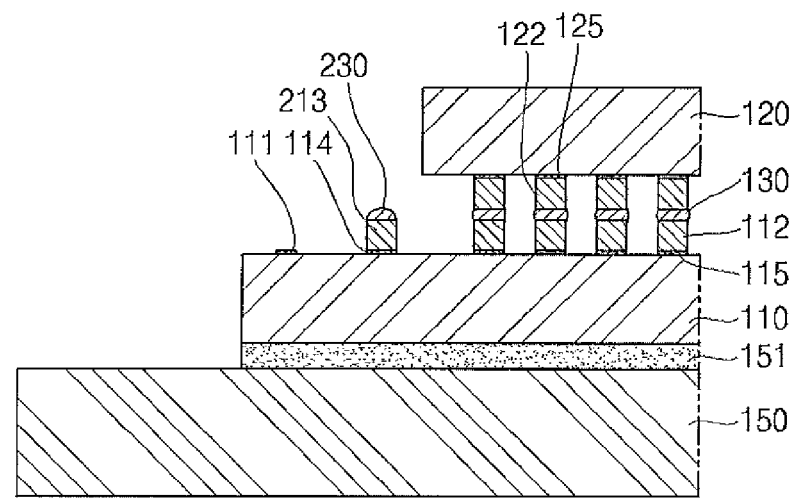

As illustrated in FIG. 6C, in step S4, the first semiconductor die 110 and the second semiconductor die 120 may be electrically interconnected to each other. First, the second metal pillars 122 of the second semiconductor die 120 are positioned on the first metal pillars 112 of the first semiconductor die 110. The first metal pillars 112 and or the second metal pillars 122 are formed with the conductive bumps 130 thereon. Subsequently, the conductive bumps 130 may be melted by increasing the temperature to approximately 150 to 250° C. Then, the temperature may be reduced to cool the conductive bumps 130 down to room temperature. This cooling allows the first metal pillars 112 to be electrically connected to the second metal pillars 122.

Figure 6D:
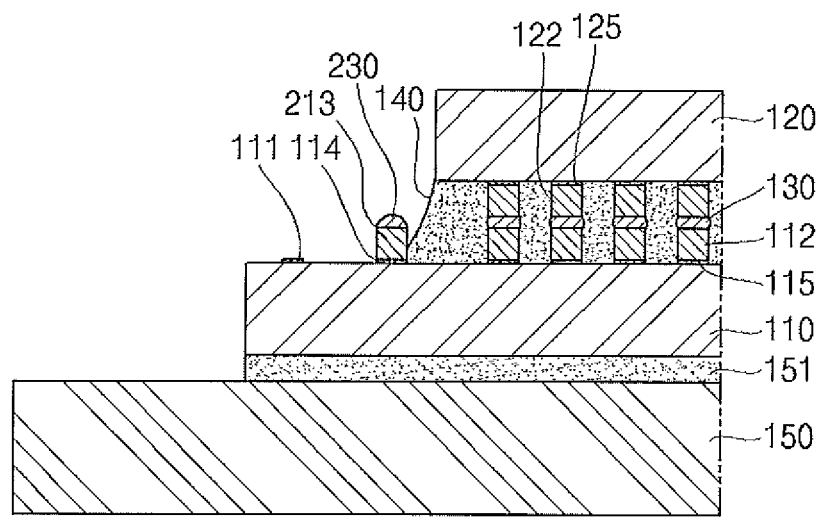

As illustrated in FIG. 6D, in step S5, an underfill 140 is filled in a gap between the first semiconductor die 110 and the second semiconductor die 120. The underfill 140 flows into the gap between the first semiconductor die 110 and the second semiconductor die 120 and surrounds the first metal pillars 112, the second metal pillars 122 and the conductive bumps 130.

The underfill 140 flowing in the circumferential direction of the first semiconductor die 110 is stopped by the metal dam 213 of the first semiconductor die 110. That is, excessive bleed-out of the underfill 140 is prevented by the metal dam 213, and therefore, the bond pad 111 of the first semiconductor die 110 is protected from contamination by the underfill 140.

Figure 6E:
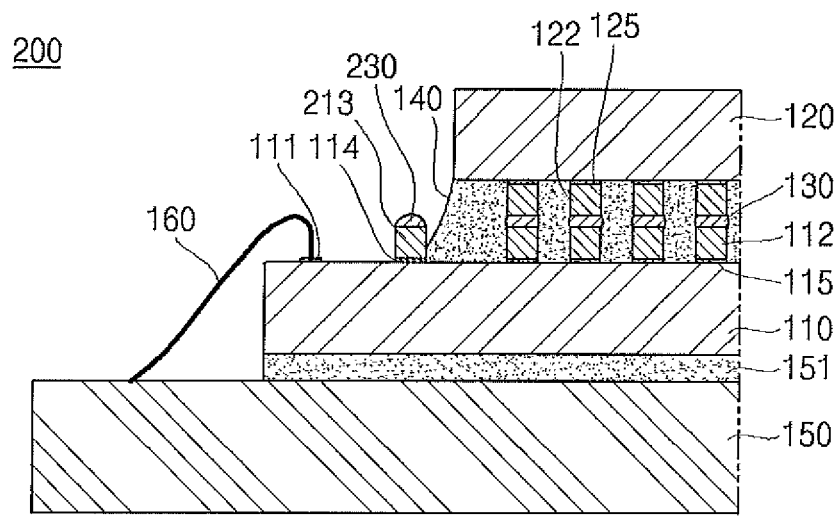

As illustrated in FIG. 6E, in step S6, the bond pad 111 of the first semiconductor die 110 and the substrate 150 may be bonded to each other through a conductive wire 160. The method may further include encapsulating the first semiconductor die 110, the second semiconductor die 120 and the conductive wire 160 by an encapsulant after step S6. Marking, sawing and solder ball attachment steps may be further carried out after the encapsulation.

In the fabrication of the semiconductor device 200, a metal dam 210 may be further formed between the bond pad 111 and the first metal pillars 112 in step S1. In step S5, bleeding-out of the underfill 140 is efficiently prevented by the metal dam 213. The metal dam 213 and the first metal pillars 112 may be formed at the same time, which eliminates the need for an additional process for forming a dam in subsequent processing steps. The metal dam 213 may be formed with a width and a thickness similar to those of the first metal pillars 112. These dimensions may improve the form factor of the semiconductor device 200.

In step S1, an electrode for metal plating is connected to sequentially form the outermost first semiconductor die 110 and the first metal pillars 112, which makes the metal dam 213 relatively thicker than the first metal pillars 112. As a result of the metal plating, the thicknesses of the first metal pillars 112 become relatively uniform.

The method may further include removing the conductive bump 230 formed on the metal dam 213 after step S4. The removal of the conductive bump 230 completes the fabrication of the semiconductor device 100 illustrated in FIG. 1. That is, the semiconductor device 100 has the same structure as the semiconductor device 200 of FIG. 2, except that the conductive bump 230 is removed.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device, comprising a first semiconductor die having at least one metal pillar formed along an inner perimeter and at least one bond pad formed along an outer perimeter;
   a second semiconductor die having at least one metal pillar;
   a conductive bump connecting the at least one metal pillar of the first semiconductor die to the at least one metal pillar of the second semiconductor die;
   at least one metal dam formed on the first semiconductor die between the at least one metal pillar of the first semiconductor die and the at least one bond pad, said at least one metal dam being formed in the same process and of the same metal as the at least one metal pillar of the first semiconductor die; and
   a metal dam conductive bump formed on the at least one metal dam.

2. The semiconductor device of claim 1, wherein the at least one metal pillar of the first semiconductor die is made of a material selected from gold (Au), nickel (Ni), copper (Cu), eutectic solders, lead-free solders, nickel-gold (Ni—Au) alloys, copper-nickel (Cu—Ni) alloys, copper (Cu) lead-free solders, and combinations thereof.

3. The semiconductor device of claim 1, wherein the at least one metal pillar of the second semiconductor die is made of a material selected from gold, nickel, copper, eutectic solders, lead-free solders, nickel-gold alloys, copper-nickel alloys, copper lead-free solders, and combinations thereof.

4. The semiconductor device of claim 1, wherein the at least one metal dam is made of a material selected from gold, nickel, copper, eutectic solders, lead-free solders, nickel-gold alloys, copper-nickel alloys, copper lead-free solders, and combinations thereof.

5. The semiconductor device of claim 1, wherein the conductive bump has a melting point lower than melting points of the at least one metal pillar of the first semiconductor die and the at least one metal pillar of the second semiconductor die.

6. The semiconductor device of claim 1, wherein the conductive bump is made of one of a eutectic solder or a lead-free solder.

7. The semiconductor device of claim 1, further comprising a seed metal layer formed between the at least one metal dam and the first semiconductor die.

8. The semiconductor device of claim 1, wherein the at least one metal dam is thicker than the at least one metal pillar of the first semiconductor die.

9. The semiconductor device of claim 1, wherein the metal dam conductive bump formed on the at least one metal dam is made of a material selected from eutectic solders, lead-free solders, and combinations thereof.

10. The semiconductor device of claim 1, wherein the first semiconductor die is coupled to a substrate.

11. The semiconductor device of claim 10, further comprising a conductive wire coupled to the bond pad and to the substrate.

12. The semiconductor device of claim 1, wherein the at least one metal dam has a width of approximately 1 to 100 µm.

13. The semiconductor device of claim 1, further comprising an underfill placed between the first semiconductor die and the second semiconductor die.

14. The semiconductor device of claim 1, wherein the at least one metal pillar of the first semiconductor die and the at least one metal pillar of the second semiconductor die each has a thickness greater than a thickness of the conductive bump.

15. The semiconductor device of claim 1, wherein the at least one metal dam has a thickness greater than the conductive bump.

16. A semiconductor device, comprising
   a first semiconductor die having at least one metal pillar formed along an inner perimeter and at least one bond pad formed outside the inner perimeter;
   a second semiconductor die having at least one metal pillar;
   a conductive bump connecting the at least one metal pillar of the first semiconductor die to the at least one metal pillar of the second semiconductor die;
   means formed on the first semiconductor die between the at least one metal pillar of the first semiconductor die and the at least one bond pad for protecting the at least one bond pad from being contaminated by an underfill, said means for protecting being formed in the same process and of the same metal as the at least one metal pillar of the first semiconductor die; and
   a metallic bump formed on the means for protecting.

17. The semiconductor device of claim 16, wherein the means for protecting the at least one bond pad from being contaminated by an underfill is made of a material selected from gold, nickel, copper, eutectic solders, lead-free solders, nickel-gold alloys, copper-nickel alloys, copper lead-free solders, and combinations thereof.

18. The semiconductor device of claim 16,
   further comprising a seed metal layer formed between the means for protecting the at least one bond pad and the first semiconductor die.

19. The semiconductor device of claim 16, wherein the means for protecting the at least one bond pad is thicker than the at least one metal pillar of the first semiconductor die.

20. The semiconductor device of claim 16, wherein the metallic bump formed on the means for protecting the at least one bond pad is made of a material selected from eutectic solders, lead-free solders, and combinations thereof.

21. A semiconductor package comprising:
   a first semiconductor die bonded to a substrate, said first semiconductor die having metal pillars formed along an inner perimeter and at least one bond pad formed outside the inner perimeter of metal pillars;
   a second semiconductor die having one or more metal pillars;
   conductive bumps formed on the metal pillars of the first semiconductor die prior to connecting the metal pillars of the first semiconductor die to the one or more metal pillars of the second semiconductor die;
   at least one metal dam formed on the first semiconductor die between the metal pillars formed along an inner perimeter and the at least one bond pad; and
   metal dam conductive bumps formed on the at least one metal dam in the same metal plating process used to form the conductive bumps on the metal pillars of the first semiconductor die.

22. The semiconductor device according to claim 21, wherein the metal pillars of the first semiconductor die are made of a material selected from gold (Au), nickel (Ni), copper (Cu), eutectic solders, lead-free solders, nickel-gold (Ni—Au) alloys, copper-nickel (Cu—Ni) alloys, copper (Cu) lead-free solders, and combinations thereof.

23. The semiconductor device according to claim 21, wherein the one or more metal pillars of the second semiconductor die is made of a material selected from gold, nickel, copper, eutectic solders, lead-free solders, nickel-gold alloys, copper-nickel alloys, copper lead-free solders, and combinations thereof.

24. The semiconductor device according to claim 21, wherein the at least one metal dam is made of a material selected from gold, nickel, copper, eutectic solders, lead-free solders, nickel-gold alloys, copper-nickel alloys, copper lead-free solders, and combinations thereof.

25. The semiconductor device according to claim 21, wherein the conductive bumps placed on the metal pillars of the first semiconductor die have a melting point lower than melting points of the at least one metal pillar of the first semiconductor die and the at least one metal pillar of the second semiconductor die.

26. The semiconductor device according to claim 21, wherein a seed metal layer is formed between the at least one metal dam and the first semiconductor die.

\* \* \* \* \*

UNITED STATES PATENT AND TRADEMARK OFFICE
CERTIFICATE OF CORRECTION

| | | |
|---|---|---|
| PATENT NO. | : 8,441,123 B1 | Page 1 of 1 |
| APPLICATION NO. | : 12/540593 | |
| DATED | : May 14, 2013 | |
| INVENTOR(S) | : Lee et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 570 days.

Signed and Sealed this
Sixteenth Day of December, 2014

Michelle K. Lee
*Deputy Director of the United States Patent and Trademark Office*